(12) United States Patent
Glasser et al.

(10) Patent No.: US 6,748,103 B2
(45) Date of Patent: *Jun. 8, 2004

(54) MECHANISMS FOR MAKING AND INSPECTING RETICLES

(75) Inventors: Lance A. Glasser, Saratoga, CA (US); Jun Ye, Palo Alto, CA (US); Shauh-Teh Juang, Saratoga, CA (US); David S. Alles, Los Altos, CA (US); James N. Wiley, Menlo Park, CA (US)

(73) Assignee: KLA-Tencor, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/359,444

(22) Filed: Feb. 4, 2003

(65) Prior Publication Data

US 2003/0142860 A1 Jul. 31, 2003

Related U.S. Application Data (63) Continuation of application No. 09/213,744, filed on Dec. 17, 1998, now Pat. No. 6,529,621.

(51) Int. Cl.$^7$ .................................................. G06K 9/00
(52) U.S. Cl. ........................................ 382/149; 382/147
(58) Field of Search .................................. 382/141, 144, 382/145, 147, 149; 430/5, 30; 348/86, 87, 92; 438/16, 14

(56) References Cited

U.S. PATENT DOCUMENTS 6,557,162 B1 * 4/2003 Pierrat .......................... 716/21
6,654,488 B1 * 11/2003 Behun et al. ................ 382/144

* cited by examiner

Primary Examiner—Timothy M. Johnson
Assistant Examiner—Ali Bayat
(74) Attorney, Agent, or Firm—Beyer, Weaver & Thomas, LLP.; Mary Ramos Olynick, Esq.

(57) ABSTRACT

A reusable circuit design for use with electronic design automation EDA tools in designing integrated circuits is disclosed, as well as reticle inspection and fabrication methods that are based on such reusable circuit design. The reusable circuit design is stored on a computer readable medium and contains an electronic representation of a layout pattern for at least one layer of the circuit design on an integrated circuit. The layout pattern includes a flagged critical region which corresponds to a critical region on a reticle or integrated circuit that is susceptible to special inspection or fabrication procedures. In one aspect of the reusable circuit design, the special analysis is performed during one from a group consisting of reticle inspection, reticle production, integrated circuit fabrication, and fabricated integrated circuit inspection.

26 Claims, 8 Drawing Sheets

|  | Layer #1 | Location | Tag |
|---|---|---|---|
| Cell A = | Figure 1 | $(x,y)_1(x,y)_2$ | 1 |
|  | Figure 2 | $(x,y)_1(x,y)_2$ | 0 |
|  | Figure 3 | $(x,y)_1(x,y)_2$ | 1 |
|  | Figure 4 | $(x,y)_1(x,y)_2$ | 0 |
| Cell B = | Cell A | (x,y) | - |
|  | Cell A | (x,y) | - |
|  | Cell A | (x,y) | - |
|  | Cell B | (x,y) | - |
|  | Cell B | (x,y) | - |
|  | Cell B | (x,y) | - |

Figure 5B

|  | Layer #1 | Location | Tag |
|---|---|---|---|
| Cell A = | Figure 1 | $(x,y)_1(x,y)_2$ | gate |
|  | Figure 2 | $(x,y)_1(x,y)_2$ | - |
|  | Figure 3 | $(x,y)_1(x,y)_2$ | contact |
|  | Figure 4 | $(x,y)_1(x,y)_2$ | - |
| Cell B = | Cell A | (x,y) | - |
|  | Cell A | (x,y) | - |
|  | Cell A | (x,y) | - |
|  | Cell B | (x,y) | - |
|  | Cell B | (x,y) | - |
|  | Cell B | (x,y) | - |

MECHANISMS FOR MAKING AND INSPECTING RETICLES

CROSS-REFERENCE TO RELATED APPLICATIONS

This application is a continuation of U.S. Pat. No. 09/213,744 filed Dec. 17, 1998, now U.S. Pat. No. 6,529,621 by Lance A. Glasser et al, which application is incorporated herein by reference in its entirety for all purposes.

BACKGROUND OF THE INVENTION

The present invention relates generally to integrated circuit design and fabrication systems. More specifically, the invention relates to mechanisms for generating and inspecting reticles.

Generation of reticles and subsequent optical inspection of such reticles have become standard steps in the production of semiconductors. Initially, circuit designers provide circuit pattern data, which describes a particular integrated circuit (IC) design, to a reticle production system, or reticle writer. The circuit pattern data is typically in the form of a representational layout of the physical layers of the fabricated IC device. The representational layout typically includes a representational layer for each physical layer of the IC device (e.g., gate oxide, polysilicon, metallization, etc.), wherein each representational layer is composed of a plurality of polygons that define a layer's patterning of the particular IC device.

The reticle writer uses the circuit pattern data to write (e.g., typically, an electron beam writer or laser scanner is used to expose a reticle pattern) a plurality of reticles that will later be used to fabricate the particular IC design. A reticle inspection system may then inspect the reticle for defects that may have occurred during the production of the reticles.

A reticle or photomask is an optical element containing transparent and opaque, semi-transparent, and phase shifting regions which together define the pattern of coplanar features in an electronic device such as an integrated circuit. Reticles are used during photolithography to define specified regions of a semiconductor wafer for etching, ion implantation, or other fabrication process. For many modern integrated circuit designs, an optical reticle's features are between about 1 and about 5 times larger than the corresponding features on the wafer. For other exposure systems (e.g., x-ray, e-beam, and extreme ultraviolet) a similar range of reduction ratios also apply.

Optical reticles are typically made from a transparent medium such as a borosilicate glass or quartz plate on which is deposited on an opaque and/or semi-opaque layer of chromium or other suitable material. However, other mask technologies are employed for direct e-beam exposure (e.g., stencil masks), x-ray exposure (e.g., absorber masks), etc. The reticle pattern may be created by a laser or an e-beam direct write technique, for example, both of which are widely used in the art.

After fabrication of each reticle or group of reticles, each reticle is typically inspected by illuminating it with light emanating from a controlled illuminator. An optical image of the reticle is constructed based on the portion of the light reflected, transmitted, or otherwise directed to a light sensor. Such inspection techniques and apparatus are well known in the art and are embodied in various commercial products such as many of those available from KLA-Tencor Corporation of San Jose, Calif.

During a conventional inspection process, the optical image of the reticle is typically compared to a baseline image. The baseline image is either generated from the circuit pattern data or from an adjacent die on the reticle itself. Either way, the optical image features are analyzed and compared with corresponding features of the baseline image. Each feature difference is then compared against a single threshold value. If the optical image feature varies from the baseline feature by more than the predetermined threshold, a defect is defined.

Although conventional reticle inspections provide adequate levels of detection accuracy for some applications, other applications require a higher sensitivity or lower threshold value (for identifying defects) while other applications require less stringent, higher threshold levels. Since conventional inspections analyze all features of a given type of reticle with the same threshold and analysis algorithm, some features are inspected too stringently while other are not inspected stringently enough.

For example, critical features of an integrated circuit typically include gate widths of the semiconductor transistor devices. That is, a gate width on the reticle needs to produce a corresponding gate width on the circuit pattern within a relatively small margin of error in order for the fabricated IC device to function properly. If the threshold is set too high, these critical gate areas are not checked adequately enough. Conversely, other features, such as the widths of the interconnections between gate areas, do not affect the function of the integrated circuit as much as the gate area width and, thus, do not need to be inspected as stringently as other features, such as gate width. If the threshold is set too low, too many of these noncritical features may be defined as defects such that the inspection results are difficult to interpret and/or computational resources are overloaded.

In sum, conventional inspection systems waste valuable resources by inspecting regions of the reticle too stringently, and not reliably inspecting other regions stringently enough. In other words, the above described inspection system fails to reliably detect defects within critical areas and inefficiently inspects noncritical regions where somewhat larger defects will not present a problem. Conventional inspection systems and techniques are unable to distinguish between critical and noncritical areas of the reticle. Put in another way, conventional design documentation (e.g., electronic reticle or integrated circuit information) fails to adequately transmit the IC designer's intent regarding the circuit tolerance and resulting IC device dimensions to reticle writer systems, reticle inspection systems, and ultimately wafer inspection systems.

What is needed is improved IC documentation and apparatus for efficiently and reliably writing and inspecting reticles and wafers for determining whether a reticle has defects in critical areas, as well as noncritical areas.

SUMMARY OF THE INVENTION

Accordingly, the present invention addresses the above problems by providing apparatus and methods for transmitting the designer's intent to the pattern generator, the reticle inspection system and ultimately to the wafer inspection system and for efficiently and reliably inspecting reticles. The present invention provides mechanisms for flagging critical or noncritical regions of an IC circuit pattern data base. Other design flow procedures, such as reticle production and inspection and IC device fabrication, may then be based on the flagged critical or noncritical areas of the IC circuit pattern database.

In one embodiment, a circuit design for use with electronic design automation (EDA) tools in designing integrated circuits is disclosed. The circuit design is stored on a computer readable medium and contains an electronic representation of a layout pattern for at least one layer of the circuit design on an integrated circuit. The layout pattern includes a flagged critical region which corresponds to a critical region on a reticle or integrated circuit that is susceptible to a special inspection or fabrication procedure. The flagged critical region contains a flag that is readable by an inspection or fabrication system. In a preferred embodiment, the circuit design is reusable.

In one aspect of the circuit design, the special analysis is performed during a technique selected from the group consisting of reticle inspection, reticle production, integrated circuit fabrication, and fabricated integrated circuit inspection. In another aspect of the invention, the circuit design includes (i) a base representation containing the entire layout pattern without denoting the flagged critical region and (ii) a shadow representation that flags the critical region without denoting the entire layout pattern. In one embodiment, both the base and shadow representations are configured to together provide instructions for generating or inspecting a single reticle.

In another aspect of the invention, a method of producing a reticle for an integrated circuit device is disclosed. An electronic representation is provided to a reticle producing system. The electronic representation has a flagged critical region that indicates to the reticle producing system that an associated critical region of the reticle requires a special production technique. A reticle based on the electronic representation is produced. The critical region of the reticle associated with the flagged critical region of the electronic representation is produced via the special production technique and other regions of the reticle are produced via a normal production technique. A computer readable medium for storing computer readable code that implements the above reticle production method is also described.

In another method aspect of the invention, a method of inspecting a reticle for defining a circuit layer pattern is provided. The reticle has a special analysis region associated with a critical region and a normal analysis region associated with a normal region. An electronic representation of the circuit layer pattern is provided. The representation has a normal region of the pattern and a flagged critical region of the pattern. A test reticle image of the reticle is provided. A baseline representation containing an expected pattern of the test reticle image is also provided. The test reticle image is compared to the baseline representation such that (i) regions of the test reticle image and the baseline representation corresponding to the normal analysis region of the reticle are compared via a normal analysis and (ii) regions of the test reticle image and the baseline representation corresponding to the special analysis region of the reticle are compared via a special analysis.

In a preferred embodiment, the comparison further includes determining whether a special parameter of the special analysis region is within a first threshold of an associated parameter of the baseline special analysis region. The comparison also may include determining whether a normal parameter of the special analysis region is within a second threshold of an associated parameter of the baseline normal analysis region. A computer readable medium for storing computer readable code that implements the above reticle inspection method is also described.

In another apparatus aspect, a circuit design for use with electronic design automation (EDA) tools in designing integrated circuits is disclosed. The circuit design is stored on a computer readable medium and contains an electronic representation of a layout pattern for at least one layer of the circuit design on an integrated circuit. The layout pattern includes a flagged noncritical region which corresponds to a noncritical region on a reticle or integrated circuit that is susceptible to special inspection or fabrication procedure. The flagged noncritical region contains a flag that is readable by an inspection or fabrication system.

In an alternative embodiment, the special inspection procedure includes using a low stringency threshold to compare the noncritical region of the reticle or integrated circuit to the flagged noncritical region of the layout pattern and using a normal stringency threshold to compare a normal region of the reticle or integrated circuit that is outside of the flagged noncritical region to a normal region of the layout pattern that is outside the flagged noncritical region of the layout pattern.

The present invention has several advantages. For example, the present invention allows more than one type of inspection, an enhanced or special inspection and a normal inspection. This feature results in significant improvements to the inspection process by providing flexible inspection techniques for various applications. Additionally, by facilitating an enhanced inspection for certain critical areas of the reticle and/or wafer, the present invention may contribute to significant increases in device yield. That is, as IC device speed increases, structures must meet tighter tolerance requirements, and the present invention provides mechanisms for meeting these tighter tolerance requirements economically, that is, without requiring all features to be patterned and inspected to the tighter tolerance requirements.

These and other features and advantages of the present invention will be presented in more detail in the following specification of the invention and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF SPECIFIC EMBODIMENTS

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
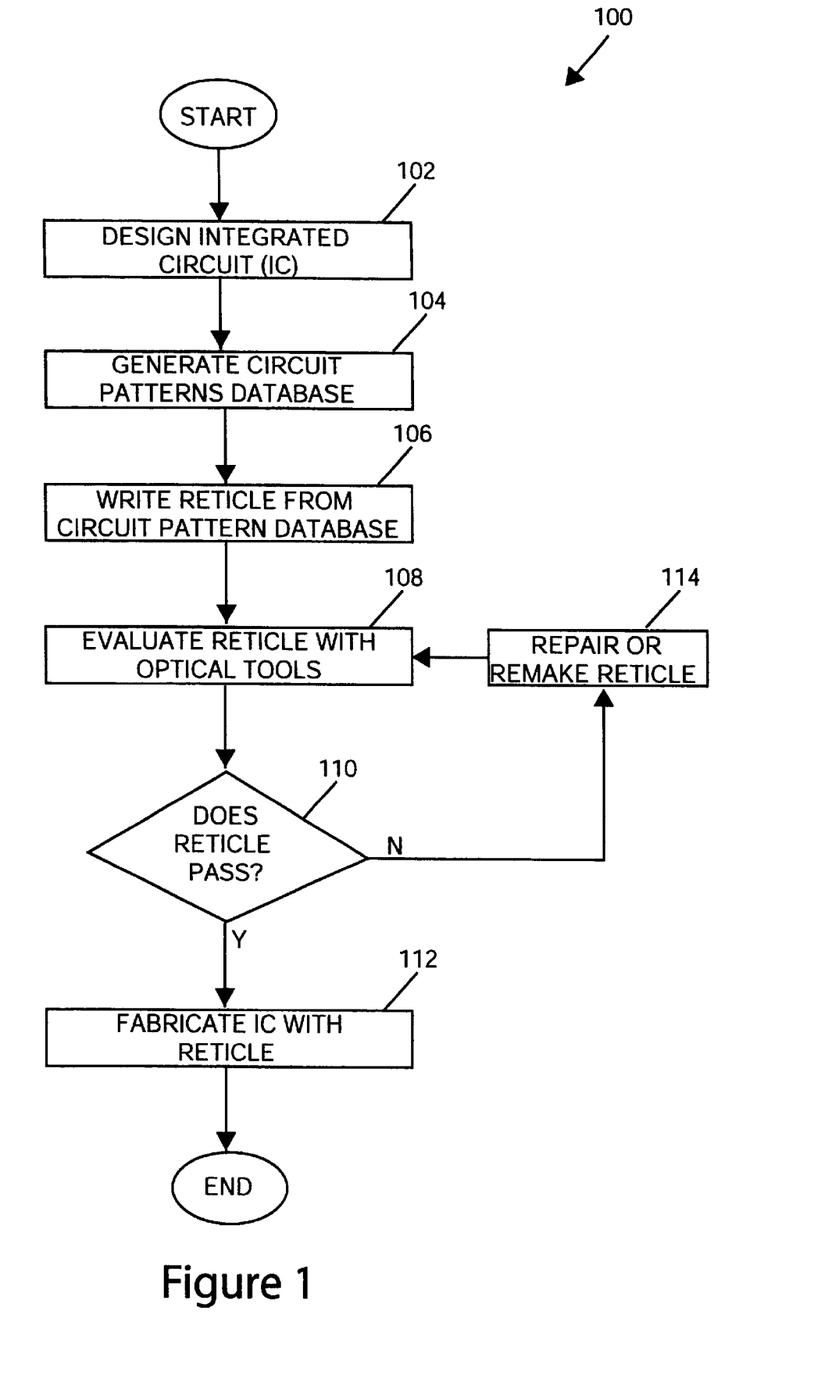
FIG. 1 is a flowchart illustrating an integrated circuit design process in accordance with one embodiment of the present invention.

FIG. 1 is a flowchart illustrating an integrated circuit design process 100 in accordance with one embodiment of the present invention. Initially, in operation 102, an integrated circuit (IC) device is designed using any suitable design techniques. For example, an IC designer may use preexisting schematic library blocks to form the IC device using, for example, electronic design automation (EDA) tools. In some cases, the IC designer may create the IC device or part of the IC device from scratch with the aid of any suitable design system, such as conventional computer aided design (CAD) tools. For example, the IC designer may use a schematic CAD tool to plan the logic diagrams for a particular IC device. Still further, the IC designer may write a description of the IC device or portions of the IC device with the aid of a hardware design language, such as VHDL.

Next, in operation 104 the IC designer generates a circuit pattern database (commonly referred to as a "layout") from the IC design in operation 104. The circuit pattern database is composed of a plurality of electronic representations of layout patterns for IC layers that are later converted into a plurality of reticles that are used to fabricate a plurality of physical layers of an IC device. Each physical layer of the fabricated IC device corresponds to one of the reticles and an associated one of the electronic representations of the circuit pattern database. For example, one electronic representation may correspond to a diffusion pattern on a silicon substrate, another to a gate oxide pattern, another to a gate polysilicon pattern, another to a contact pattern on an interlayer dielectric, another to a line pattern on a metallization layer, and so on. Each electronic representation is composed of a plurality of polygons or other shapes (herein, referred to as "figures"), which together define the reticle pattern.

The circuit pattern database may be generated using any suitable technique, for example, by using EDA or CAD tools. For example, the IC designer may manually lay out the circuit patterns for the IC device with or without preexisting library cells. Alternatively, a synthesis tool may automatically create circuit patterns for the IC device from scratch or by piecing together preexisting library cells.

In this invention, the circuit pattern database may include flagged portions of particular electronic representations that will be used to inform an inspection system to inspect corresponding portions of the reticle and/or fabricated IC device according to a special inspection process. The flagged portions may also be used to inform a fabrication system to fabricate corresponding portions of the reticle and/or IC device according to a special fabrication process. Mechanisms for flagging portions of the database and using such flagged portions to inspect or fabricate a reticle or IC device are further described below.

After the circuit pattern database is generated, the circuit pattern database is used to produce a plurality of reticles in operation 106. The reticles may be produced by any suitable pattern generator or reticle writer equipment, such as a MEBES4500, commercially available from ETEC of Hayward, Calif.

Each reticle corresponds to one or more electronic representation(s) from the circuit pattern database. A reticle is then inspected in operation 108, and it is determined whether the reticle passes inspection in operation 110. If the reticle passes inspection, the reticle may then be used to fabricate a physical layer of the IC device in operation 112. However, if the reticle does not pass inspection, the reticle is either repaired or remade in operation 114, and the new reticle is inspected in operation 108. Operations 106 through 112 are implemented for each electronic representation of the circuit pattern database.

The present invention may be implemented on any suitable inspection tools. For example, a KLA 301 or 351 Reticle Inspection Tool, commercially available from KLA-Tencor of San Jose, Calif., may be employed. One embodiment of an inspection system is described below in reference to FIG. 9.

At least one of the electronic representations of the circuit pattern database will include one or more flagged critical regions and other nonflagged normal regions. The flagged region(s) will later be used to indicate that corresponding critical region(s) of the reticle or of the fabricated IC device requires a special inspection or fabrication procedure.

The flagged region(s) may be flagged by any suitable technique for distinguishing the flagged region(s) from other regions of the layer. For example, an electronic representation of a given layer may contain specific flags or tags on certain ones of the "figures" making up that representation. In another embodiment, a specific layer designation may be used to identify or flag the critical region(s). In other words, two layer types are used together to represent the same circuit layer representation. (The layer type containing the flagged regions is sometimes referred to herein as a "shadow representation." The other layer type is sometimes referred to herein as a "base representation.")

Both the shadow and base representation may be used to form the same reticle, as well as for inspecting the fabricated reticle. Alternatively, an electronic representation may include multiple different shadow representations for flagging different types of critical regions on the same reticle. For example, one shadow representation may flag regions to be inspected with a high stringency threshold level or sensitivity level, while another may flag regions to be inspected with a special algorithm. Alternatively, noncritical regions may be flagged to indicate that the corresponding flagged regions are to be inspected with a low stringency threshold level, as compared to the normal regions.

Figure 2:
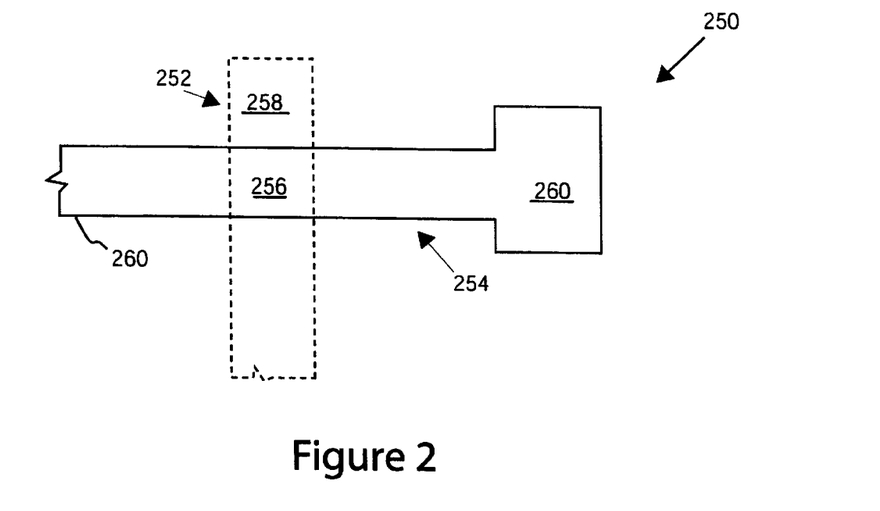
FIG. 2 is a diagram of two electronic representations of layout patterns used to fabricate a transistor in accordance with one embodiment of the present invention.

FIG. 2 is a diagram of two electronic representations of layout patterns used to fabricate a transistor. Together, the two electronic representations provide a transistor representation 250 in accordance with one embodiment of the present invention. As shown, the transistor representation 250 includes (i) a poly layer electronic representation 254 representing a polysilicon layer of the transistor, and (ii) a diffusion layer electronic representation 252 representing the layout of a diffusion on a semiconductor substrate. The poly layer electronic representation 254 provides the pattern of the polysilicon layer including a gate area of the transistor 250.

The diffusion layout pattern is indicated by a dotted boundary in electronic representation 252. Residing within the dotted boundary is an active region 258. It contains no critical regions and so has no flagged regions in this example. The polysilicon layout pattern is indicated by a solid boundary in electronic representation 254. Residing within the solid boundary is a polysilicon strip 260. It contains a flagged critical region 256 at its gate electrode. In poly level electronic representation 254, the critical region is defined by the intersection of active region 258 (from the diffusion electronic representation) and polysilicon strip 260. Thus, poly electronic representation 254 includes both a critical region 256 and a normal region including all of region 260 or at least the portions of 260 lying outside of critical region 256.

The flagged region may be used to perform enhanced inspections and/or fabrication procedures for the reticle and/or fabricated IC device. For example, although the flagged critical region and unflagged regions may both be used to make the polysilicon reticle, the flagged critical region may also be used to indicate that the corresponding critical region of the reticle may be subject to an enhanced inspection. By way of another example, the flagged critical region may be used to indicate the corresponding critical region of the reticle may be subject to enhanced reticle fabrication procedures, such as using a relatively narrow electron beam to write the critical region of the reticle.

Any suitable technique may be implemented for distinguishing the normal and critical regions. Two examples will now be provided to illustrate the range of options. One way to flag the critical regions is to use one or more shadow representation(s). Each shadow representation may flag one or more specific critical region(s) of a layout pattern for a level of the integrated circuit design under consideration.

In addition to the shadow representation(s), the electronic representation for a layer of a circuit design may include a base representation containing the entire pattern (or at least those portions of the pattern outside the flagged region(s) in the shadow layer) of the layer under consideration. If the base representation includes the entire pattern, it may be used by itself to fabricate the reticle, while the shadow representation is merely used to indicate a critical region of the reticle that requires an enhanced inspection or fabrication. Thus, the base representation may be provided to the pattern generator or reticle writer so that reticles may be fabricated from the base representation, while the shadow representation(s) are passed through to the inspection or fabrication equipment so that the reticles or fabricated IC devices may be inspected based on the shadow representation(s). Alternatively, the shadow representation(s) may also be used to fabricate the associated critical regions of the reticle (or possibly the IC device).

More than one type of shadow representation may be used to indicate different types of inspection or fabrication procedures. For example, a set of shadow regions may be used to flag different regions of the reticle that require different inspection thresholds. By way of another example, the shadow regions may be used to flag different regions of the reticle that require qualitatively different inspection procedures, such as checking the region's area size or average width, as compared to merely checking the region's edge position.

Figure 3:
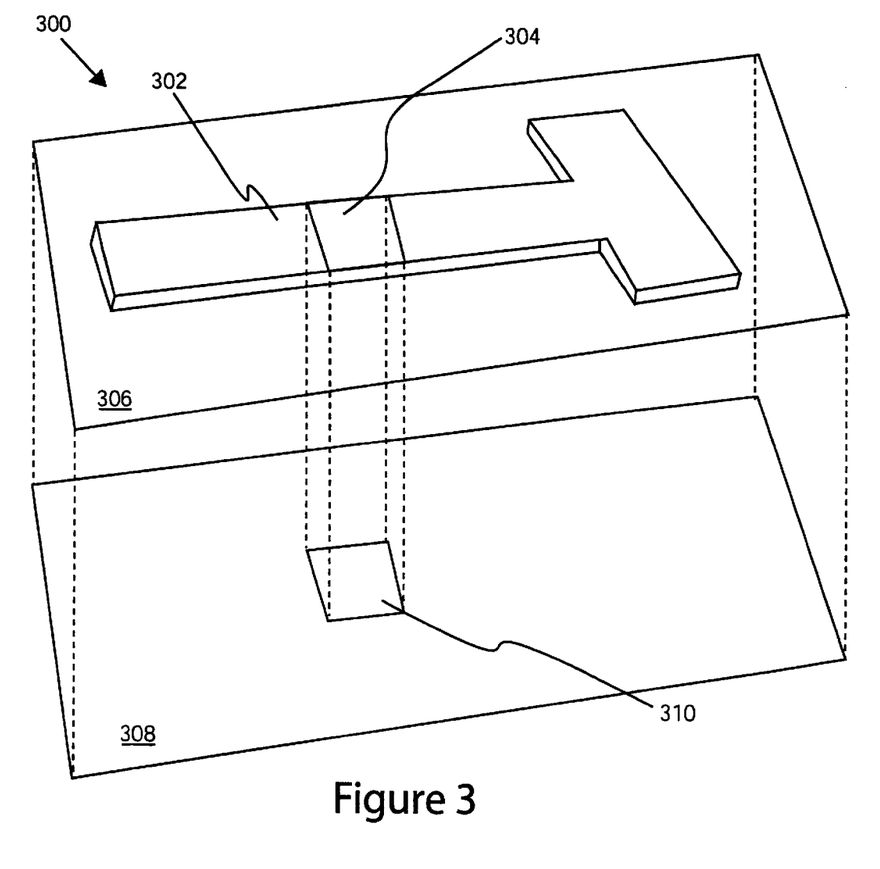
FIG. 3 is a diagram of a portion of a circuit pattern database having a base layer representation and a shadow representation in accordance with one embodiment of the present invention.

Following from the example of FIG. 2, FIG. 3 is a diagram of a portion of a circuit pattern database 300 having a base representation 306 and a shadow representation 308. Together representations 306 and 308 may denote a polysilicon layer of a transistor. In one embodiment, the base representation may be used to fabricate a reticle, while the shadow representation is not used to fabricate a reticle. Instead, the shadow representation may only be used to inspect the reticle or fabricated IC device or to fabricate the IC device. Alternatively, both the base and shadow representations may be used to fabricate the reticle. In this case, the critical regions of the shadow representation specify a special fabrication procedure (e.g., enhanced resolution by using narrower electron beams) while the base representation generally specifies a normal resolution fabrication procedure.

For inspection, the shadow representation may be used alone or in conjunction with the base representation. When both representations are used, the base representation will be provided to an inspection system to specify those regions of the reticle or wafer subject to a normal inspection procedure. The shadow representation, in contrast, will tell the inspection system which regions of the reticle or wafer require special inspection. When the shadow representation is used alone, the inspection system may inspect only those regions provided in the shadow representation (which includes at least the critical regions). Alternatively, the shadow region may be used to indicate areas requiring reduced sensitivity or no inspection at all.

In the example shown, the base representation 306 defines the pattern of a polysilicon strip 302 that includes a critical portion 304 that is flagged as region 310 in underlying shadow representation 308. That is, critical portions are flagged by adjacent shadow representations. As described above, the shadow representation may then be used to perform special inspections and/or fabrication procedures for the reticle and/or fabricated IC device. Note that when a shadow representation is used, the critical region may not need to be flagged in the base representation.

The base and shadow representation may take any convenient form readable by inspection or fabrication systems (or computers controlling such systems). Preferably, they take the form of files or other suitable machine readable data containing a list of figures (shapes or polygons) and their associated positions in a reticle or die layout. Various standard formats for such geometric layouts are available and widely used.

Another technique for flagging critical regions of an electronic representation of circuit pattern layout for a particular layer involves providing a modified base or standard representation of the layer. This embodiment does not rely on a shadow representation. In this embodiment, a file or database table for the circuit layer under consideration contains a list of figures defining the pattern layout and an associated flag for at least those figures comprising a critical region.

Figure 4:
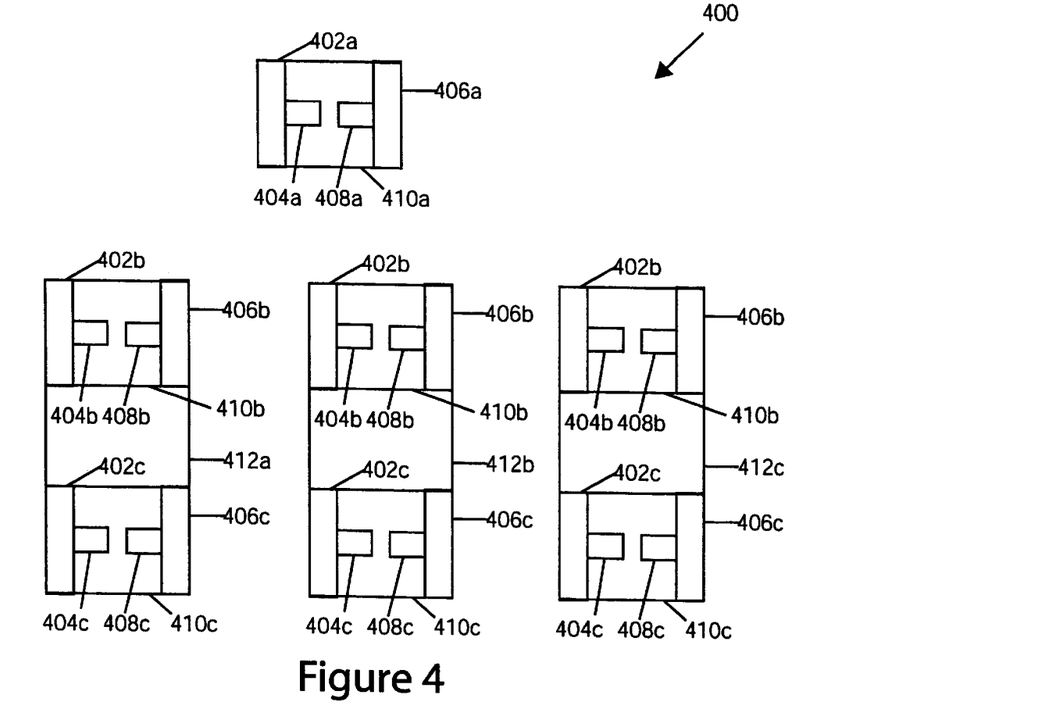
FIG. 4 is a diagrammatic representation of a circuit pattern layout in accordance with one embodiment of the present invention.
Figure 5A:
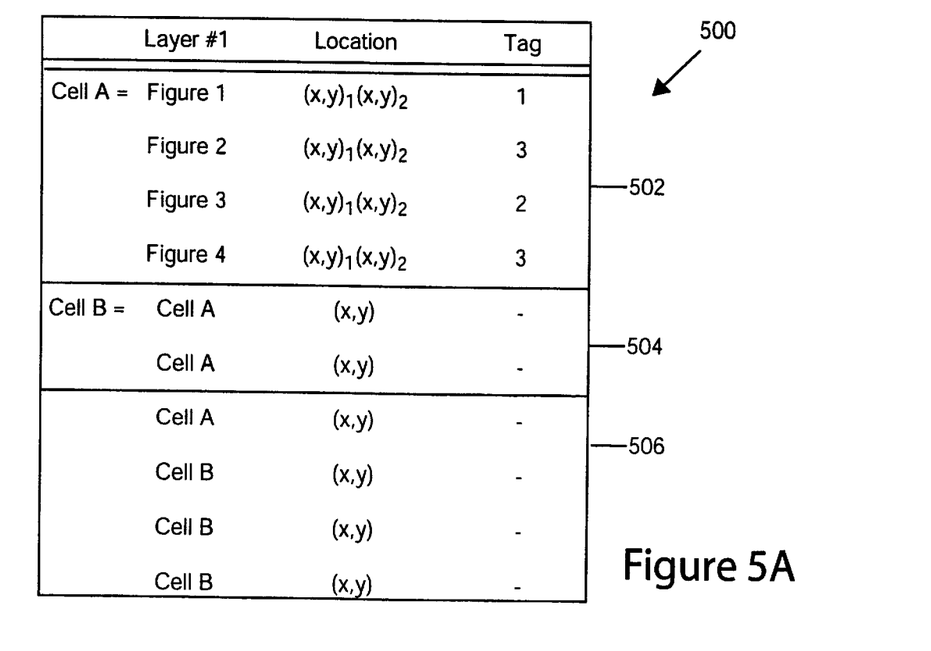
FIGS. 5A through 5C are corresponding database structures that represent the circuit pattern layout of FIG. 4 in accordance with three embodiments of the present invention.
Figure 5B:
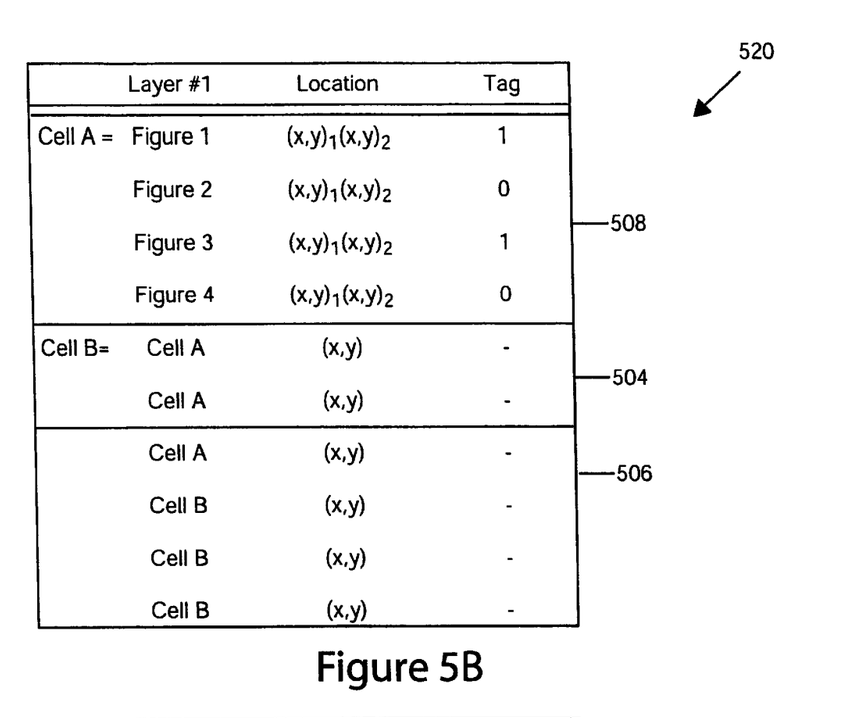
Figure 5C:
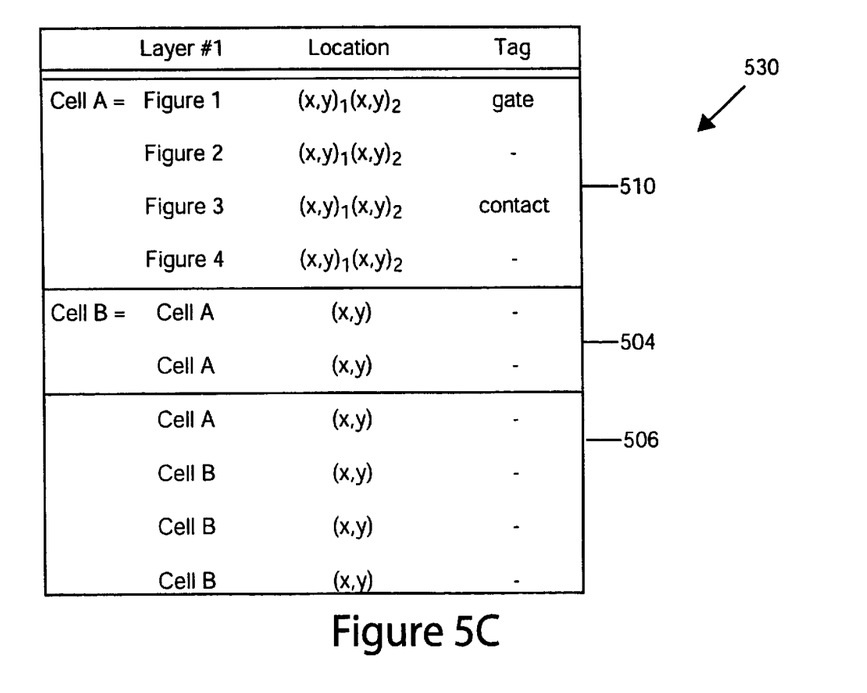

Any suitable database structure may be implemented for the circuit pattern database of the present invention. FIG. 4 is a diagrammatic representation of a circuit pattern layout 400, and FIGS. 5A through 5C are corresponding database structures that represents the circuit pattern layout 400 of FIG. 4 in accordance with three embodiments of the present invention. A circuit pattern layout (such as that depicted in FIG. 4) may be provided as a reusable library cell for use with EDA tools, an original design custom made for a particular integrated circuit, or any other electronic representation used to depict layers in an integrated circuit design. Although only one layer is represented in the databases of FIGS. 5A through 5C, of course, the database may include the entire set of layers that correspond to all physical layers of a particular IC device.

As shown, the circuit pattern 400 includes a plurality of cell A's 410. Each cell A 410 includes a plurality of figures. As mentioned above, figures may be polygons or other shapes that when depicted together form an IC layer's pattern representation. For example, cell 410a includes FIGS. 402a, 404a, 406a, and 408a. Each layer and cell may have one or more figures. Together these figures may define the patterning of a polysilicon layer at a specific location on an integrated circuit. Alternatively, they may define the patterning of diffusions in a substrate, a metallization layer, etc. The circuit pattern 400 also includes a plurality of cell B's 412 that are each composed of two cell A's 410. Each figure may also be flagged and associated with a particular tag or flag as shown in FIGS. 5A through 5C.

The database structures may be organized in any suitable form. For example, the database structures may be in the form of a hierarchical list of figures and cells. As shown in FIG. 5A, the database 500 for a single layer ("layer #1") of the circuit design includes a cell A definition 502, a cell B definition 504, and a listing of cells 506. The cell A definition 502 includes four figures (FIGS. 1 through 4). Each figure has a set of coordinates that denote the sizes and position of each figure within a cell A. The cell B definition 504 includes two cell A's and their respective relative positions. The listing of cells 506 represent the cells of FIG. 4. Thus, the listing 506 includes a cell A that corresponds to the cell A 410a and three cell B's that correspond to the three cell B's 412a through 412c.

Each figure is associated with a particular tag that indicates a type of inspection or fabrication procedure. Any suitable tag for distinguishing procedure types may be implemented. For example, each tag may indicate one of a plurality different threshold values for inspecting the corresponding reticle portions. In other words, the tag is related to how stringently the associated figure is to be inspected, As shown in FIG. 5A, a tag may represent one of a plurality of threshold values, such as a "1" value which indicates a highest threshold, a "2" value which indicates a medium threshold, or a "3" which indicates a lowest threshold. Alternatively, as shown in FIG. 5B, a tag may simply indicate whether or not to perform an enhanced inspection for the particular figure. For example, the tag is either a "1" or "0" value.

By way of a final example, as shown in FIG. 5C, a tag may indicate a particular inspection algorithm is to be implemented for the associated critical area of the reticle. The tag "gate" may indicate that an enhanced inspection for transistor gates is to be performed on FIG. 1. The enhanced inspection for gates may include, for example, checking the average width or length of FIG. 1. The tag "contact" may indicate that an enhanced inspection procedure for contacts is to be performed on FIG. 3. The enhanced inspection procedure may be especially applicable to checking contacts. For example, the special inspection procedure for contacts may include checking the area of the contact (FIG. 3).

The above described tags may facilitate inspection of reticles, as well as the fabricated IC device. For example, the flags may be used to select a particular inspection algorithm or to select the stringency level (e.g., threshold level) of the inspection for a particular region of the reticle and/or IC device. Additionally, the tags may facilitate fabrication of such reticles and/or IC devices. For example, the flagged regions may be used to indicate that special attention and care is to be given while fabricating the corresponding critical regions of the reticle and/or IC device.

Figure 6:
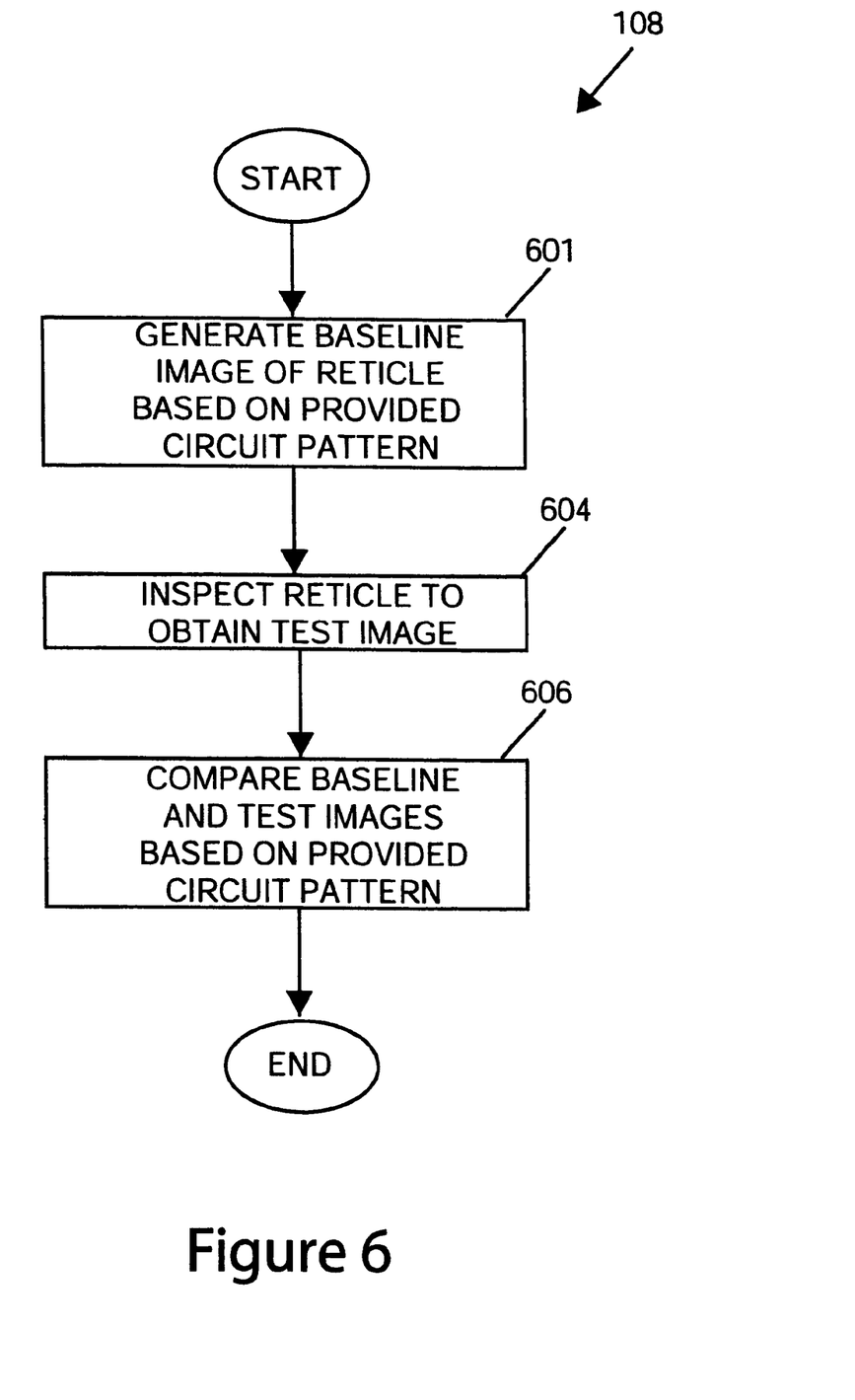
FIG. 6 is a flowchart illustrating the operation of FIG. 1 of inspecting and evaluating the fabricated reticle in accordance with one embodiment of the present invention.

FIG. 6 is a flowchart illustrating the operation 108 of FIG. 1 of inspecting and evaluating the fabricated reticle in accordance with one embodiment of the present invention. Initially, in operation 601 a baseline image of the reticle may be generated or "rendered" from the provided circuit pattern database. The baseline image may be generated in any suitable manner, such as by merely directly converting the contents of the circuit pattern database into an image. Alternatively, the circuit pattern database may be rendered by simulating fabrication results from making a reticle that perfectly matches the circuit pattern database. For example, the corners of a circuit pattern in the baseline image may be rounded to account for corner rounding that commonly occurs during fabrication of a reticle. The baseline image may also include simulated optical effects from retrieving an optical image of the simulated reticle. Such optical effects are necessarily encountered when an optical inspection technique is used to evaluate a reticle. Additionally, a vendor may provide the end user of the reticle, e.g. a fabrication facility, with the baseline image of the reticle and perform the above described steps of baseline generation phase 601.

Alternatively, the baseline image may be generated from an adjacent die of the reticle in a die-to-die inspection approach. In this approach, the images of two supposedly identical patterns on a reticle are generated, one for a baseline image and one for a test image described below. Note that many reticles contain the layout patterns of multiple identical (and adjacent) die.

After the baseline image has been provided at operation 601, the reticle is inspected to obtain a test image of the reticle or a portion of the reticle under analysis in operation 604. Any suitable mechanism may be implemented for obtaining the test image. For example, an optical or ebeam image be obtained. In operation 606, the test image is compared to the baseline image. This comparison is based, in part, on the flagged critical regions of the provided circuit pattern database. In other words, the flagged regions indicate the type of inspection to be performed on the corresponding region of the reticle.

Figure 7:
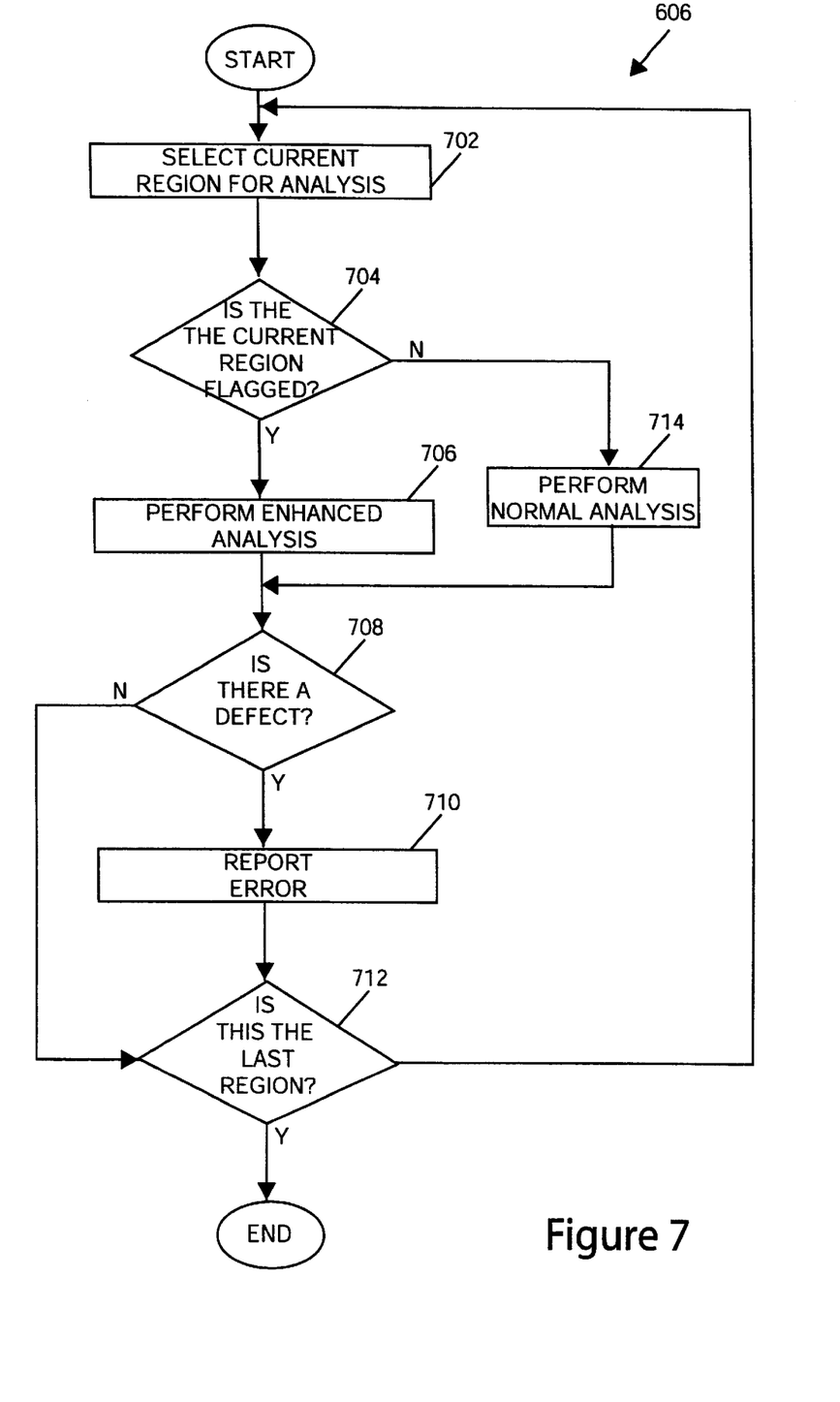
FIG. 7 is a flowchart illustrating the operation of FIG. 6 of comparing the test and baseline images in accordance with one embodiment of the present invention.

FIG. 7 is a flowchart illustrating the operation 606 of FIG. 6 of comparing the test and baseline images in accordance with one embodiment of the present invention. In operation 702, a current region of the reticle is selected for analysis. It is then determined whether the current region is flagged as a critical region in operation 704.

If the current region is flagged as a critical region, an enhanced analysis is performed on the corresponding critical region of the reticle, or representative test image, in operation 706. Otherwise, if the current region is not flagged, a normal analysis is performed in operation 714.

The enhanced analysis may include any suitable type of inspection procedure for verifying whether the resulting reticle meets design specifications. In one embodiment, the enhanced analysis provides a way to inspect more stringently to determine whether the corresponding critical regions meet design specifications, as opposed to a less stringent inspection of normal, nonflagged regions. For example, an edge of the critical region on the test image may be compared to an edge of the baseline image, and it is then determined whether the edge positions vary by more than an enhanced threshold. By way of another example, the enhanced analysis may include a qualitatively different analysis from the normal analysis. That is, a different inspection algorithm is used for the enhanced analysis than for the normal analysis.

A normal analysis may be in the form of any inspection procedure that is suitable for implementing on most regions of the reticle (e.g., the non-critical regions of the reticle). For example, the normal analysis may use a conventional threshold for inspecting the normal (or nonflagged) regions of the reticle. Such thresholds are typically less stringent than those employed in critical regions. In other words, some variations from the baseline that would constitute defects under enhanced analysis will not constitute defects under normal analysis. In some cases, the "normal analysis" for some particular types of reticle may actually require no inspection. That is, the reticle features in the unflagged regions may be so unimportant that they are allowed to include any number of defects. CMP markings may be one such type of feature.

Figure 8A:
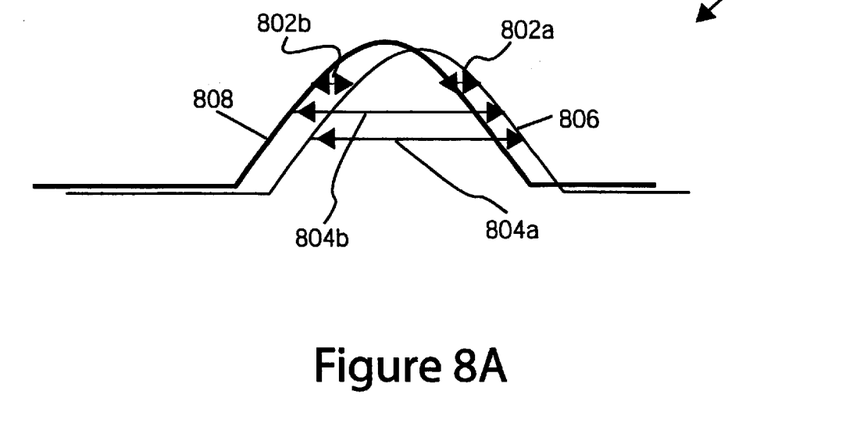
FIG. 8A is a diagram of a first example of an enhanced analysis and a normal analysis in accordance with one embodiment of the current invention.

FIG. 8A is a diagram of a first example of an enhanced analysis and a normal analysis in accordance with one embodiment of the current invention. As shown, a test feature 806 (i.e., a feature under analysis) is compared to a baseline feature 808. The baseline feature corresponds to expected results, and the test feature corresponds to actual results of reticle fabrication.

During a normal analysis, the test feature's edge positions are merely compared to the baseline feature's edge positions. As shown, a positive difference 802*a* and a negative difference 802*b* is calculated for the two edges. A total difference may then be calculated for the test and baseline features. In analyses, the positive and negative differences cancel each other out, so that the total difference between the feature sizes would be about equal to zero. If the design requirements specify that the test feature must not vary from the baseline feature by more than a normal threshold, the normal analysis may result in a defect that is undetected. More typically, the magnitudes of the edge position deviations are summed. In such cases, a defect would normally be found in the FIG. 8A example.

However, if some other parameter of the test feature is deemed more important than the positions of the test feature edges relative to the baseline feature edges, the feature may be flagged to indicate that a qualitatively different inspection is to be performed. For example, the feature may be flagged as a gate (see FIG. 5C) or line to indicate that an average width 804*a* of the feature under analysis is to be compared to an average width of the baseline feature 804*b*. Alternatively, the feature may be flagged to indicate that the average width of the test feature must be within a predetermined range. These comparisons and analyses might be useful when the line or gate width is far more critical than an offset in the overall positions of the lines or gates. If both the line width and overall position are important, the region could be subject to both normal analysis (edge position) and enhanced analysis (line width). In the example of FIG. 8A, a line width analysis would likely indicate that there is not a significant deviation between the baseline and current images (while the normal edge position analysis would indicate a defect).

Figure 8B:
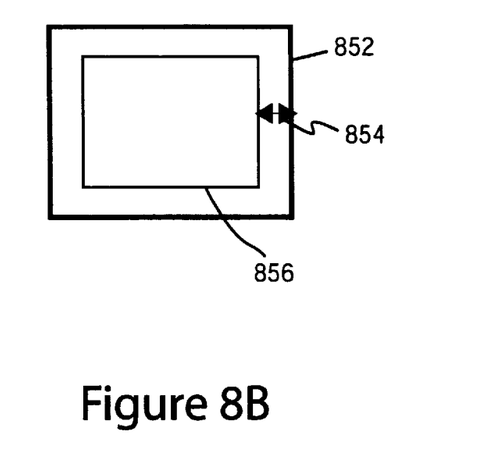
FIGS. 8B and 8C are diagrams of a second and third example of an enhanced analysis and a normal analysis in accordance with one embodiment of the current invention.
Figure 8C:
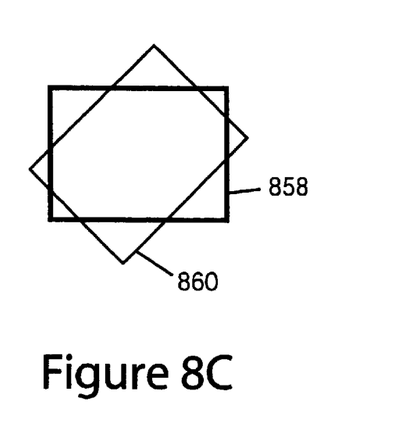

FIGS. 8B and 8C are diagrams of a second and third example of an enhanced analysis and a normal analysis in accordance with one embodiment of the current invention. As shown in FIG. 8B, a test feature 856 is compared to a baseline feature 852. During a normal inspection, as described above, edge differences (e.g. 854) are calculated between the test and baseline features. In this example, the edge differences may be relatively small or could cancel each other out even though the overall size of the test feature is significantly different from the baseline feature's overall size. In contrast, as shown in FIG. 8C, although the test feature 860 has about the same area size as the baseline feature 858, the edge differences might be relatively large and not cancel each other out under a normal analysis and, thus, the total edge differences will be significant. In sum, as shown in FIG. 8B, significant area differences may not be detected, and as shown in FIG. 8C, identical areas may result in defect detection.

In some applications, normal analysis is not adequate for inspecting certain critical features of the IC device, such as contacts. That is, the contact needs to be a certain minimum area size to accommodate a particular energy throughput, for example. Also, the particular shape of a contact is not important, as long as the area size is adequate. Accordingly, the present invention allows the baseline feature to be flagged to indicate an enhanced inspection that includes checking the area size. For example, the flag may indicate that the area of the feature under analysis is to be compared to the baseline feature's area. Thus, if the area of certain reticle features is an important design requirement, the present invention allows corresponding baseline images to be flagged as requiring an enhanced analysis that employs area comparisons.

Turning back to FIG. 7, after analysis is complete for the current region, it is then determined whether there is a defect in operation 708 (e.g., the edge position, area, or line width deviation between the baseline and current images is greater than a defined threshold). If there is a defect, an error report may be generated in operation 710. It is then determined whether there are any more regions to inspect in operation 712. If there are more regions to inspect, a new current region is obtained in operation 702 and analyzed. Otherwise, if there are no more regions, the process 606 ends.

Figure 9:
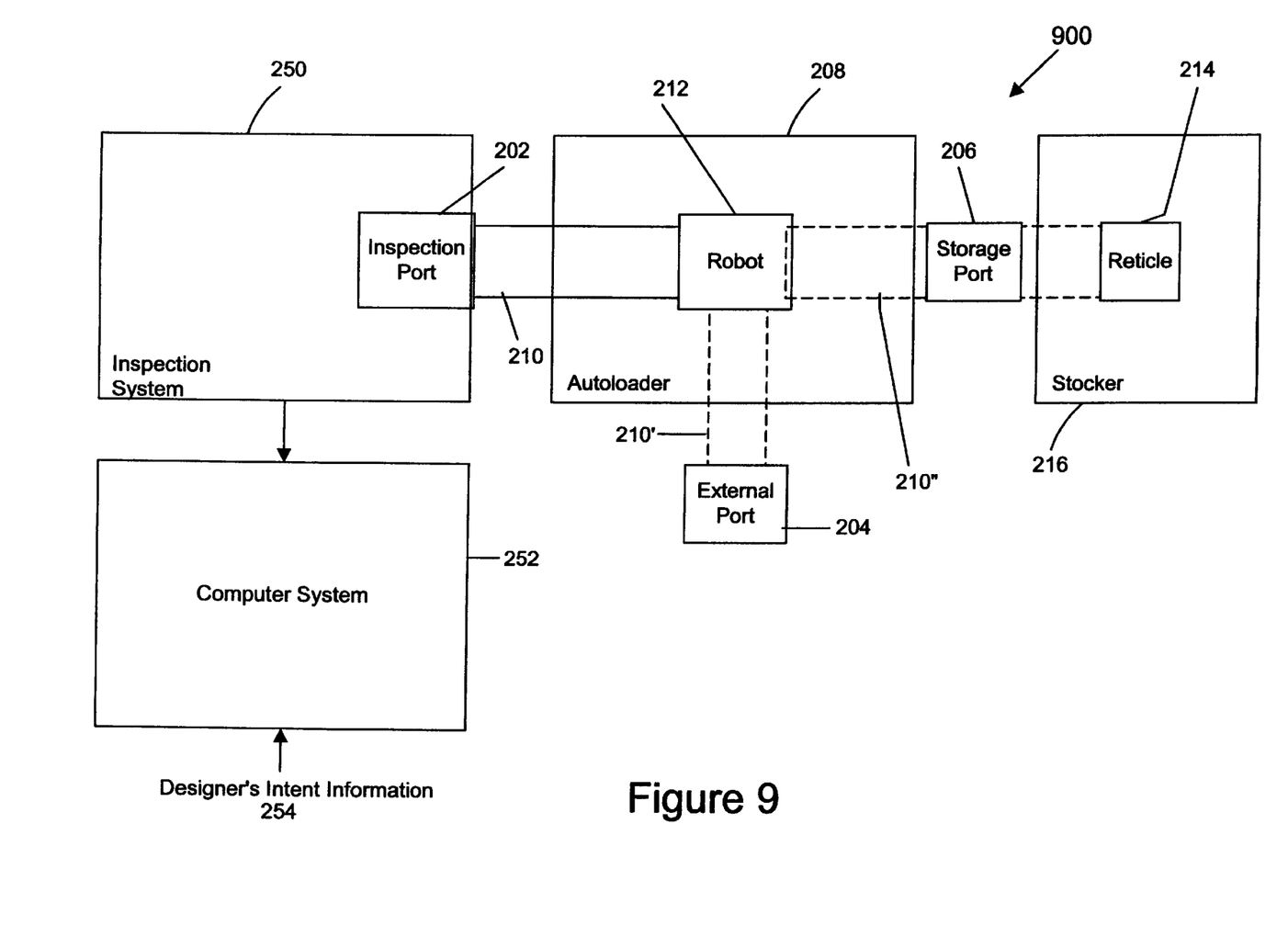
FIG. 9 shows a reticle inspection station-reticle stocker station upon which process of FIG. 6 of inspecting the reticle would be implemented in a preferred embodiment of the present invention.

The invention may be used with any suitable inspection or fabrication system. FIG. 9 shows a reticle inspection station-reticle stocker station 900 where process 108 of FIG. 6 would be implemented in a preferred embodiment of the present invention. An autoloader 208 for automatically transporting reticles includes a robot 212 having an arm 210 extending towards a inspection port 202 of a reticle inspection station 250. Arm 210 may rotate and can extend towards an external port 204 when in its state denoted by reference number 210'. Similarly, when in its state denoted by reference number 210", the robotic arm can also extend towards a storage port 206 of a reticle stocker station 216 that typically includes several slots or tracks for storing reticles. The robotic arm is designed to further extend and retrieve a reticle 214 from reticle stocker station 216.

A typical inspection process, according to one embodiment of the present invention, may begin after reticle 214 is placed on external port 204, with the intention of storing the reticle in reticle stocker station 216 until it is used in a subsequent inspection application, for example. Robotic arm in its position 210' transports the reticle from external port 204 and stores it in a loading port of reticle stocker station 216 by extending as shown in FIG. 9. When the reticle is needed for production, for example, robotic arm 210"

retrieves reticle 214 from the loading port and places it on inspection port 202 of inspection system 250.

The inspection system 250 is coupled with a computer system 252 where inspection process 108 of FIG. 6 detailed above is carried out and it is determined whether the reticle has passed inspection. The computer system 252 may be integral to inspection system 250 or separate from the inspection system 250. The inspection system 250 receives data 254 regarding the designer's intent in the form of data structures, for example, having flags for regions that require special inspection. Additionally, the computer system 252 receives image data from the inspection system 250. The image data is analyzed based, at least in part, on the user's design intent data 254. After the reticle inspection has concluded, reticle 214 is placed on external port 204 so that it may be carried to a fabrication facility for use, assuming of course, that it has passed inspection. Alternatively, the reticle 214 may be repaired or remade.

Suitable computer systems for use in implementing and controlling the methods in the present invention (e.g., controlling the settings of the various scanning apparatus components, retrieving database records specifying regions of normal and enhanced analysis, storing baseline image of the reticle, storing a new image of the reticle, comparing the new image with the baseline image, storing the location of defects, etc.) may be obtained from various vendors. In one preferred embodiment, an appropriately programmed Silicon Graphics 0-200 computer (Mountain View, Calif.) or Sun SPARC (Sun Microsystems, Sunnyvale, Calif.) may be employed. In any case, the computer system preferably has one or more processors coupled to input/output ports, and one or more memories via appropriate buses or other communication mechanisms.

The term "electronic representation" as used herein covers any machine readable representation. Typically, such representations are stored on magnetic, electronic, or optically readable media. The content of such representations may be transmitted as electrical signals, magnetic signals, electromagnetic signals, optical signals, etc.

Preferably, an optical, electron beam, or other inspection system is integrated with a computer system which implements many of the method steps of this invention. Such composite system preferably includes at least (a) a baseline image (preferably compacted) stored in a memory, (b) an imaging system arranged to generate an optical or electron beam image of the reticle, and (c) a processing unit configured to compare the baseline and current test images and thereby identify defects. At a minimum, the imaging system will usually include (i) a source of illumination oriented to direct radiation onto a specified location of the reticle; and (ii) one or more detectors oriented to detect an image of the reticle from the source which has been scattered by the reticle. The imaging system may also include a scanning means.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. For example, critical areas of the circuit pattern may be flagged by providing tags within a corresponding schematic netlist or database, and the schematic database is then used to inspect the reticle. By way of another example, regions may be flagged to indicate a less stringent or no inspection (e.g., for the noncritical CMP layer). Additionally, the regions may be flagged to indicate an extra inspection analysis, in addition to a normal analysis that is performed on both the unflagged and flagged regions. Accordingly, the present embodiments are to be considered as illustrative and not restrictive, and the invention is not to be limited to the details given herein, but may be modified within the scope and equivalents of the appended claims.

What is claimed is:

1. A method of inspecting a sample having a sample pattern, the method comprising:

providing a representation of the sample pattern, the representation having a plurality of flagged regions and a plurality of unflagged regions, wherein each flagged and unflagged region corresponds to a specific region of the sample pattern;

performing a process on the sample so as to form at least a portion of the pattern on the sample; and inspecting the regions of the formed sample pattern for defects thereon, wherein only the regions of the sample pattern which correspond to unflagged regions of the representation are inspected while the regions of the sample pattern which correspond to flagged regions of the representation are not inspected.

2. A method as recited in claim 1, wherein the sample is an integrated circuit.

3. A method as recited in claim 1, wherein the sample is a reticle.

4. A method as recited in claim 1, wherein the representation is an electronic representation of the sample pattern.

5. A method of processing a sample comprising:

providing an electronic representation of a layout pattern for the sample to a sample processing system, the electronic representation having a flagged critical region that indicates to the sample processing system that an associated critical region of the sample requires a special production technique; and producing a sample based on the electronic representation, wherein the critical region of the sample associated with the flagged critical region of the electronic representation is produced via the special production technique and other regions of the sample are produced via a normal production technique, wherein the special production technique differs from the normal production technique.

6. The method as recited in claim 5, wherein the flagged critical region of the representation contains a flag that is readable by the sample processing system.

7. The method as recited in claim 5, wherein the flagged critical region is identified in a shadow representation which together with a base representation defines the entire layout representation.

8. The method as recited in claim 5, further comprising inspecting the critical region of the sample differently from other portions of the sample.

9. A method of inspecting a sample having a special analysis region associated with a critical region and a normal analysis region associated with a normal region, the method comprising:

providing an electronic representation of the sample, the representation having a normal region corresponding to the normal analysis region of the sample and a flagged critical region corresponding to the special analysis region of the sample;

providing a test image of the sample;

providing a baseline representation containing an expected pattern of the test image; and comparing the test image to the baseline representation such that (i) regions of the test image and the baseline representation corresponding to the normal analysis region of the sample are compared via a normal analysis and (ii) regions of the test image and the baseline representation corresponding to the special analysis region of the sample are compared via a special analysis, wherein the special analysis differs from the normal analysis.

10. A method as recited in claim 9, wherein the test image is an electronic optical image.

11. A method as recited in 9, wherein the special analysis is performed at a more stringent threshold than the normal analysis.

12. A method as recited in 11, wherein the normal analysis compares edge positions of corresponding features in the test image and the baseline representation using a first threshold and the special analysis compares edge positions of corresponding features in the test image and the baseline representation using a second threshold.

13. A method as recited in 9, wherein the special analysis compares line widths of corresponding features in the test image and the baseline representation.

14. A method as recited in 13, wherein the corresponding features are gate electrodes.

15. A method as recited in 9, wherein the special analysis compares areas of corresponding features in the test image and the baseline representation.

16. A method as recited in 15, wherein the corresponding features are vias or contact holes.

17. A method as recited in 9, the comparison comprising determining whether a special parameter of the special analysis region is within a first threshold of an associated parameter of the baseline special analysis region.

18. A method as recited in claim 17, the comparison further comprising determining whether a normal parameter of the special analysis region is within a second threshold of an associated parameter of the baseline normal analysis region.

19. A method as recited in claim 18, wherein the second threshold has a greater value than the first threshold.

20. A method as recited in claim 18, wherein the special parameter is an average width or width of a line in the special analysis region.

21. A method as recited in claim 20, wherein the normal parameter is an edge position of the test normal analysis region.

22. A method as recited in claim 18, wherein the special parameter is an area of a feature in the special analysis region.

23. A method as recited in claim 18, wherein the special analysis implements a qualitatively different algorithm than the normal analysis.

24. A method as recited in claim 9, wherein the sample is an integrated circuit.

25. A method of inspecting a sample having a sample pattern, the method comprising:

providing a representation of the sample pattern, the representation having a plurality of flagged regions and a plurality of unflagged regions, wherein each flagged and unflagged region corresponds to a specific region of the sample pattern;

performing a process on the sample so as to form at least a portion of the pattern on the sample; and inspecting the regions of the formed sample pattern for defects thereon, wherein only the regions of the sample pattern which correspond to flagged regions of the representation are inspected while the regions of the sample pattern which correspond to unflagged regions of the representation are deemed to be permissible defect areas and are not inspected.

26. A method as recited in claim 25, wherein the sample is an integrated circuit.

* * * * *